United States Patent [19]

Merchant et al.

[11] Patent Number: 4,877,545

[45] Date of Patent: Oct. 31, 1989

[54] AZEOTROPIC COMPOSITIONS OF 1,1,2-TRICHLOROTRIFLUOROETHANE AND TRANS-1,2-DICHLOROETHYLENE WITH ETHANOL, N-PROPANOL, ISOPROPANOL AND ACETONE OR WITH ETHANOL OR ACETONE AND NITROMETHANE

[75] Inventors: Abid N. Merchant, Wilmington; Robert A. Gorski, Newark, both of Del.; Kenneth C. Burke, Westfield, N.J.

[73] Assignee: E. I. Du Pont De Nemours and Company, Wilmington, Del.

[21] Appl. No.: 291,791

[22] Filed: Dec. 29, 1988

[51] Int. Cl.[4] .......................... C11D 7/50; C11D 7/30
[52] U.S. Cl. .................................... 252/171; 252/162; 252/170; 252/172; 252/364; 252/DIG. 9; 134/12; 134/38; 134/39; 134/40
[58] Field of Search ............... 252/162, 170, 171, 172, 252/364, DIG. 9; 134/12, 38, 39, 40

[56] References Cited

U.S. PATENT DOCUMENTS

| | | | |
|---|---|---|---|
| 2,999,815 | 9/1961 | Eiseman | 252/171 |
| 3,903,009 | 9/1975 | Bauer et al. | 252/171 |
| 4,767,561 | 8/1988 | Gorski | 252/171 |
| 4,803,009 | 2/1989 | Gorski | 252/171 |

OTHER PUBLICATIONS

U.S. patent application No. 07/198,015, (Allowed 9/7/88), Gorski.

*Primary Examiner*—Paul Lieberman
*Assistant Examiner*—Kathleen Markowski

[57] ABSTRACT

Azeotropic mixtures of 1,1,2-trichlorotrifluoroethane (CFC-113) with trans-1,2-dichloroethylene and ethanol, n-propanol, isopropanol or acetone. Also, Azeotropic mixtures of 1,1,2-trichlorotrifluoroethane (CFC-113), trans-1,2-dichloroethylene and ethanol or acetone with nitromethane are disclosed. The azeotropic mixtures are useful in solvent cleaning applications.

26 Claims, No Drawings

AZEOTROPIC COMPOSITIONS OF 1,1,2-TRICHLOROTRIFLUOROETHANE AND TRANS-1,2-DICHLOROETHYLENE WITH ETHANOL, N-PROPANOL, ISOPROPANOL AND ACETONE OR WITH ETHANOL OR ACETONE AND NITROMETHANE

BACKGROUND OF THE INVENTION

As modern electronic circuit boards evolve toward increased circuit and component densities, thorough cleaning of the board after soldering becomes more important. Current industrial processes for soldering electronic components to circuit boards involve coating the entire circuit side of the board with flux and thereafter passing the flux-coated board over preheaters and through molten solder. The flux cleans the conductive metal parts and promotes solder fusion. Commonly used solder fluxes generally consist of rosin, either used alone or with activating additives, such as amine hydrochlorides or oxalic acid derivatives.

After soldering, which thermally degrades part of the rosin, the remaining flux and flux-residues are often removed from the circuit boards with an organic solvent. The requirements for such solvents are very stringent. Defluxing solvents should have the following characteristics: be low boiling, be nonflammable, have low toxicity and have high solvency power, so that flux and flux-residues can be removed without damaging the substrate being cleaned.

While boiling point, flammability and solvent power characteristics can often be adjusted by mixing different solvents together, the mixtures that are formed are often unsatisfactory because they fractionate to an undesirable degree during use. Such solvent mixtures also fractionate during distillation, which makes it virtually impossible to recover and reuse a solvent mixture with the original composition.

On the other hand, azeotropic mixtures, with their constant boiling point and constant composition characteristics, have been found to be very useful for these applications. Azeotropic mixtures exhibit either a maximum or minimum boiling point and they do not fractionate on boiling. These characteristics are also important when using solvent compositions to remove solder fluxes and their residues from printed circuit boards. Preferential evaporation of the more volatile components of the solvent mixture would occur if the mixtures were not azeotropes or azeotrope-like and could result in mixtures with changed compositions having possibly less-desirable solvency properties, such as lower rosin flux solvency and lower inertness toward the electrical components being cleaned. The azeotropic character is also desirable in vapor degreasing operations where redistilled solvent is generally employed for final rinse cleaning.

Thus, vapor defluxing and degreasing systems act as a still. Unless the solvent composition exhibits a constant boiling point, i.e., is an azeotrope or is azeotrope-like, fractionation will occur and undesirable solvent distributions will result which could detrimentally affect the safety and efficacy of the cleaning operation.

A number of chlorofluorocarbon-based azeotropic compositions have been discovered and, in some cases, used as solvents for solder flux and flux-residue removal from printed circuit boards and also for miscellaneous degreasing applications. For example: U.S. Pat. No. 3,903,009 discloses the ternary azeotrope of 1,1,2-trichlorotrifluoroethane with ethanol and nitromethane; U.S. Pat. No. 2,999,815 discloses the binary azeotrope of 1,1,2-trichlorotrifluoroethane and acetone; U.S. Pat. No. 4,767,561 discloses the ternary azeotrope of 1,1,2-trichlorotrifluoroethane, trans-1,2-dichloroethylene and methanol.

Unfortunately, as recognized in the art, it is not possible to predict the formation of azeotropes. This fact obviously complicates the search for new azeotropic compositions which have application in the field. Nevertheless, there is a constant effort in the art to discover new azeotropes or azeotrope-like compositions which have improved solvency characteristics and particularly greater versatility in solvency power.

SUMMARY OF THE INVENTION

According to the present invention, an azeotrope or azeotrope-like composition has been discovered comprising an admixture of effective amounts of 1,1,2-trichlorotrifluoroethane, trans-1,2-dichloroethylene and an oxygenated compound selected from the group consisting of ethanol, n-propanol, isopropanol and acetone. Also, an azeotrope or azeotrope-like composition has been discovered comprising an admixture of effective amounts of 1,1,2-trichlorotrifluoroethane, trans-1,2-dichloroethylene, nitromethane and ethanol or acetone.

More specifically, the azeotropes are: an admixture of about 65.37 weight percent 1,1,2-trichlorotrifluoroethane, about 31.30 weight percent trans-1,2-dichloroethylene and about 3.33 weight percent ethanol; an admixture of about 58–68 weight percent 1,1,2-trichlorotrifluoroethane, about 33–39 weight percent trans-1,2-dichloroethylene and about 0.1–2.0 weight percent n-propanol; an admixture of about 59–69 weight percent 1,1,2-trichlorotrifluoroethane, about 30–36 weight percent trans-1,2-dichloroethylene and about 1–5 weight percent isopropanol; an admixture of about 67–77 weight percent 1,1,2-trichlorotrifluoroethane, about 17–24 weight percent trans-1,2-dichloroethylene and about 4–8 weight percent acetone; an admixture of about 60–70 weight percent 1,1,2-trichlorotrifluoroethane, about 27–34 weight percent trans-1,2-dichloroethylene, about 1–5 weight percent ethanol and about 0.01–1.0 weight percent nitromethane; an admixture of about 69–79 weight percent 1,1,2-trichlorotrifluoroethane, about 16–22 weight percent trans-1,2-dichloroethylene, about 4–8 weight percent acetone and about 0.01–1.0 weight percent nitromethane.

The present invention provides nonflammable azeotropic compositions which are well suited for solvent cleaning applications.

DETAILED DESCRIPTION OF THE INVENTION

The composition of the instant invention comprises admixtures of effective amounts of 1,1,2-trichlorotrifluoroethane ($CCl_2FCClF_2$, boiling point=47.6° C.), trans-1,2-dichloroethylene ($CHCl=CHCl$, boiling point=47.5° C.) and an oxygenated compound selected from the group consisting of ethanol, n-propanol, isopropanol and acetone, and in two cases also with nitromethane, to form azeotrope or azeotrope-like compositions. The fluorinated material is also known as CFC-113 in the nomenclature conventional to the chlorofluorocarbon field.

By azeotrope or azeotrope-like composition is meant a constant boiling liquid admixture of two or more substances, which admixture behaves like a single substance, in that the vapor, produced by partial evaporation or distillation of the liquid, has substantially the same composition as the liquid, i.e., the admixture distills without substantial change in composition. Constant boiling compositions, which are characterized as azeotropes or azeotrope-like, exhibit either a maximum or minimum boiling point, as compared with that of the non-azeotropic mixtures of the same substances.

For purposes of this invention, effective amount is defined as the amount of each component of the instant invention admixture which, when combined, results in the formation of the azeotrope or azeotrope-like compositions of the instant invention. This definition includes the amounts of each component, which amounts may vary depending upon the pressure applied to the composition so long as the azeotrope or azeotrope-like compositions continue to exist at the different pressures, but with possible different boiling points. Therefore, effective amount includes the weight percentages of each component of the compositions of the instant invention which form azeotrope or azeotrope-like compositions at pressures other than atmospheric pressure. When the pressure applied to these compositions is adjusted to atmospheric pressure, i.e., 760 mm Hg, they will boil at the atmospheric boiling points for the true azeotropes described herein.

It is possible to fingerprint, in effect, a constant boiling admixture which may appear under many guises, depending upon the conditions chosen, by any of several criteria:

* The composition can be defined as an azeotrope of A, B, C, (and D . . . ) since the very term "azeotrope" is at once both definitive and limitative, and requires that effective amounts of A, B, C (and D . . . ) form this unique composition of matter which is a constant boiling admixture.

* It is well known by those skilled in the art that, at different pressures, the composition of a given azeotrope will vary at least to some degree, and changes in pressure will also change, at least to some degree, the boiling point temperature. Thus an azeotrope of A, B, C (and D . . . ) represents a unique type of relationship but with a variable composition which depends on temperature and/or pressure. Therefore, compositional ranges, rather than fixed compositions, are often used to define azeotropes.

* The composition can be defined as a particular weight percent relationship or mole percent relationship of A, B, C (and D . . . ), while recognizing that such specific values point out only one particular such relationship and that in actuality, a series of such relationships, represented by A, B, C (and D . . . ) actually exist for a given azeotrope, varied by the influence of pressure.

* Azeotrope A, B, C (and D . . . ) can be characterized by defining the composition as an azeotrope characterized by a boiling point at a given pressure, thus giving identifying characteristics without unduly limiting the scope of the invention by a specific numerical composition, which is limited by and is only as accurate as the analytical equipment available.

Ternary mixtures of about 60–70 weight percent CFC-113, 27–35 weight percent trans-1,2-dichloroethylene and 2–5 weight percent ethanol are characterized as azeotropes or azeotrope-like in that mixtures having components within these ranges exhibit a substantially constant boiling point at constant pressure. Being substantially constant boiling, the mixtures do not tend to fractionate to any great extent upon evaporation. After evaporation, only a small difference exists between the composition of the vapor and the composition of the initial liquid phase. This difference is such that the compositions of the vapor and liquid phases are considered substantially identical. Accordingly, any mixture within this range exhibits properties which are characteristic of a true ternary azeotrope. The ternary composition consisting of about 65.37 weight percent CFC-113, about 31.30 weight percent trans-1,2-dichloroethylene and about 3.33 weight percent ethanol has been established, within the accuracy of the fractional distillation method, as a true ternary azeotrope, boiling at about 42.6° C., at substantially atmospheric pressure.

Also, according to the instant invention, ternary mixtures of about 58–68 weight percent CFC-113, about 33–39 weight percent trans-1,2-dichloroethylene and 0.1–2.0 weight percent n-propanol are characterized as azeotropes or azeotrope-like in that mixtures having components within these ranges exhibit a substantially constant boiling point at constant pressure. Being substantially constant boiling, the mixtures do not tend to fractionate to any great extent upon evaporation. After evaporation, only a small difference exists between the composition of the vapor and the composition of the initial liquid phase. This difference is such that the compositions of the vapor and liquid phases are considered substantially identical. Accordingly, any mixture within this range exhibits properties which are characteristic of a true ternary azeotrope. The ternary composition consisting of about 63.4 weight percent CFC-113, about 36.4 weight percent trans-1,2-dichloroethylene and about 0.2 weight percent n-propanol has been established, within the accuracy of the fractional distillation method, as a true ternary azeotrope, boiling at about 44.2° C., at substantially atmospheric pressure.

Also, according to the instant invention, ternary mixtures of about 59–69 weight percent CFC-113, about 30–36 weight percent trans-1,2-dichloroethylene and about 1–5 weight percent isopropanol are characterized as azeotropes or azeotrope-like in that mixtures having components within these ranges exhibit a substantially constant boiling point at constant pressure. Being substantially constant boiling, the mixtures do not tend to fractionate to any great extent upon evaporation. After evaporation, only a small difference exists between the composition of the vapor and the composition of the initial liquid phase. This difference is such that the compositions of the vapor and liquid phases are considered substantially identical. Accordingly, any mixture having components within these ranges exhibits properties which are characteristic of a true ternary azeotrope. The ternary composition consisting of about 64.8 weight percent CFC-113, about 33.2 weight percent trans-1,2-dichloroethylene and about 2.0 weight percent isopropanol has been established, within the accuracy of the fractional distillation method, as a true ternary azeotrope, boiling at about 43.8° C., at substantially atmospheric pressure.

Also, according to the instant invention, ternary mixtures of about 67–77 weight percent CFC-113, about 17–24 weight percent trans-1,2-dichloroethylene and about 4–8 weight percent acetone are characterized as azeotropes or azeotrope like, in that mixtures having components within these ranges exhibit a substantially constant boiling point at constant pressure. Being substantially constant boiling, the mixtures do not tend to fractionate to any great extent upon evaporation. After evaporation, only a small difference exists between the composition of the vapor and the composition of the initial liquid phase. This difference is such that the compositions of the vapor and liquid phases are considered substantially identical. Accordingly, any mixture having components within these ranges exhibits properties which are characteristic of a true ternary azeotrope. The ternary composition consisting of about 72.9 weight percent CFC-113, about 20.7 weight percent trans-1,2-dichloroethylene and about 6.4 weight percent acetone has been established, within the accuracy of the fractional distillation method, as a true ternary azeotrope, boiling at about 43.9° C., at substantially atmospheric pressure.

Also, according to the instant invention, quaternary mixtures of about 60-70 weight percent CFC-113, about 27-34 weight percent trans-1,2-dichloroethylene, about 1-5 weight percent ethanol and about 0.01-1.0 weight percent nitromethane are characterized as azeotropes or azeotrope-like, in that mixtures having components within these ranges exhibit a substantially constant boiling point at constant pressure. Being substantially constant boiling, the mixtures do not tend to fractionate to any great extent upon evaporation. After evaporation, only a small difference exists between the composition of the vapor and the composition of the initial liquid phase. This difference is such that the compositions of the vapor and the liquid phases are considered substantially identical. Accordingly, any mixture having components within these ranges exhibits properties which are characteristic of a true quaternary azeotrope. The quaternary composition consisting of about 65.9 weight percent CFC-113, about 30.6 weight percent trans-1,2-dichloroethylene, about 3.5 weight percent ethanol and about 0.01 weight percent nitromethane has been established, within the accuracy of the fractional distillation method, as a true quaternary azeotrope, boiling at about 42.5° C., at substantially atmospheric pressure.

Also, according to the instant invention, quaternary mixtures of about 69-79 weight percent CFC-113, about 16-22 weight percent trans-1,2-dichloroethylene, about 4-8 weight percent acetone and about 0.01-1.0 weight percent nitromethane are characterized as azeotropes or azeotrope-like, in that mixtures having components within these ranges exhibit a substantially constant boiling point at constant pressure. Being substantially constant boiling, the mixtures do not tend to fractionate to any great extent upon evaporation. After evaporation, only a small difference exists between the composition of the vapor and the composition of the initial liquid phase. This difference is such that the compositions of the vapor and the liquid phases are considered substantially identical. Accordingly, any mixture having components within these ranges exhibits properties which are characteristic of a true quaternary azeotrope. The quaternary composition consisting of about 74.3 weight percent CFC-113, about 19.3 weight percent trans-1,2-dichloroethylene, about 6.4 weight percent acetone and about 0.02 weight percent nitromethane has been established, within the accuracy of the fractional distillation method, as a true quaternary azeotrope, boiling at about 44.0° C., at substantially atmospheric pressure.

The azeotropes of the present invention permit easy recovery and reuse of the solvent from vapor defluxing and degreasing operations because of their azeotropic natures. As an example, the azeotropic mixtures of this invention can be used in cleaning processes such as described in U.S. Pat. No.3,881,949, which is incorporated herein by reference.

The components of the azeotropes or azeotrope-like compositions of the instant invention are known in the art and can be prepared by known methods.

The azeotropes of the instant invention can be prepared by any convenient method including mixing or combining the desired component amounts. A preferred method is to weigh the desired component amounts and thereafter combine them in an appropriate container.

EXAMPLE 1

A solution which contained 65.30 weight percent CFC-113, 30.70 weight percent trans-1,2-dichloroethylene and 4.00 weight percent ethanol was prepared in a suitable container and mixed thoroughly.

The solution was distilled in a Perkin-Elmer Model 251 Autoannular Spinning Band Still (200 plate fractionating capability), using a 15:1 reflux to take-off ratio. Head and pot temperatures were read directly to 0.01° C. and 0.1° C., respectively. All temperatures were adjusted to 760 mm pressure. Distillate compositions were determined by gas chromatography. Results obtained are summarized in Table 1.

TABLE 1

| | | | DISTILLATION OF: (65.30% + 30.70% + 4.00%) CFC-113, TRANS-1,2-DICHLOROETHYLENE AND ETHANOL | | |
|---|---|---|---|---|---|
| | TEMP. °C. | | WT. % DISTILLED OR | WEIGHT % | |
| CUTS | POT | HEAD | RECOVERED | CFC-113 | TRANS 1,2-DCE | ETOH |
| Fore-shot | — | — | 1.75 | 65.30 | 30.70 | 4.00 |
| 1 | 42.3 | 42.5 | 12.65 | 65.20 | 31.48 | 3.32 |
| 2 | 42.7 | 42.6 | 23.79 | 65.28 | 31.39 | 3.34 |
| 3 | 42.8 | 42.7 | 34.70 | 65.31 | 31.35 | 3.34 |
| 4 | 39.1 | 43.0 | 47.38 | 65.37 | 31.30 | 3.33 |
| 5 | 39.1 | 42.8 | 57.30 | 65.41 | 31.23 | 3.36 |
| 6 | 43.5 | 42.7 | 67.67 | 65.47 | 31.18 | 3.35 |
| 7 | 43.6 | 42.7 | 77.40 | 65.56 | 31.13 | 3.30 |
| Heel | — | — | 90.48 | 64.56 | 28.12 | 7.32 |

Analysis of the above data indicates very small changes in both the boiling points and the distillate compositions as the distillation progressed. A statistical analysis of the data also indicates that a true ternary azeotrope of 1,1,2-trichlorotrifluoroethane, trans-1,2-dichloroethylene and ethanol the following characteristics at atmospheric pressure (99 percent confidence limits):

| 1,1,2-trichlorotrifluoroethane | = 65.37 wt. % |
|---|---|
| trans-1,2-dichloroethylene | = 31.30 wt. % |
| ethanol | = 3.33 wt. % |

EXAMPLE 2

A solution which contained 63.60 weight percent CFC-113, 34.50 weight percent trans-1,2-dichloroethylene and 1.90 weight percent n-propanol was prepared in a suitable container and mixed thoroughly.

The solution was distilled in a Perkin-Elmer Model 251 Autoannular Spinning Band Still (200 plate fractionating capability), using a 10:1 reflux to take-off ratio. Head and pot temperatures were read directly to 0.01° C. and 0.1° C., respectively. All temperatures were adjusted to 760 mm pressure. Distillate compositions were determined by gas chromatography. Results obtained are summarized in Table 2.

TABLE 2

DISTILLATION OF:
(63.60% + 34.50% + 1.90%)
CFC-113
TRANS-1,2-DICHLOROETHYLENE AND n-PROPANOL

| CUTS | TEMPERATURES, °C. POT | HEAD | WT. % DISTILLED OR RECOVERED | WEIGHT % CFC-113 | TRANS- 1,2-DCE | nPROH |
|---|---|---|---|---|---|---|
| Foreshot | 43.4 | 44.11 | 7.6 | 63.27 | 36.54 | 0.19 |
| 1 | 43.4 | 44.13 | 19.2 | 63.32 | 36.48 | 0.20 |
| 2 | 43.5 | 44.15 | 33.2 | 63.33 | 36.46 | 0.21 |
| 3 | 43.6 | 44.17 | 48.9 | 63.33 | 36.47 | 0.20 |
| 4 | 43.9 | 44.15 | 64.4 | 63.36 | 36.44 | 0.20 |
| 5 | 44.3 | 44.17 | 76.7 | 63.38 | 36.41 | 0.21 |
| 6 | 45.3 | 44.17 | 85.0 | 63.40 | 36.38 | 0.22 |
| Heel | | | 98.7 | 65.23 | 21.83 | 12.94 |

-continued

| n-propanol | = 0.2 wt. % |
|---|---|

EXAMPLE 3

A solution which contained 63.60 weight percent CFC-113, 34.50 weight percent trans-1,2-dichloroethylene and 1.90 weight percent isopropanol was prepared in a suitable container and mixed thoroughly.

The solution was distilled in a Perkin-Elmer Model 251 Autoannular Spinning Band Still (200 plate fractionating capability), using a 10:1 reflux to take-off ratio. Head and pot temperatures were read directly to 0.01° C. and 0.1° C., respectively. All temperatures were adjusted to 760 mm pressure. Distillate compositions were determined by gas chromatography. Results obtained are summarized in Table 3.

TABLE 3

DISTILLATION OF:
(63.60% + 34.50% + 1.90%)
CFC-113, TRANS-1,2-DICHLOROETHYLENE AND ISOPROPANOL

| CUTS | TEMPERATURES, °C. POT | HEAD | WT. % DISTILLED OR RECOVERED | WEIGHT % CFC-113 | TRANS- 1,2-DCE | iPROH |
|---|---|---|---|---|---|---|
| Foreshot | 43.7 | 43.81 | 5.2 | 64.76 | 33.21 | 2.03 |
| 1 | 43.7 | 43.81 | 13.4 | 64.78 | 33.19 | 2.03 |
| 2 | 43.7 | 43.83 | 27.0 | 64.78 | 33.20 | 2.02 |
| 3 | 43.7 | 43.84 | 41.0 | 64.78 | 33.20 | 2.02 |
| 4 | 43.7 | 43.84 | 50.0 | 64.78 | 33.20 | 2.02 |
| 5 | 43.6 | 43.83 | 67.0 | 64.77 | 33.21 | 2.02 |
| 6 | 43.7 | 43.84 | 76.3 | 64.77 | 33.21 | 2.02 |
| 7 | 43.9 | 43.84 | 88.0 | 64.78 | 33.20 | 2.02 |
| 8 | 44.2 | 43.84 | 91.0 | 64.73 | 33.23 | 2.04 |
| Heel | | | 98.8 | 51.47 | 48.18 | 0.35 |

Analysis of the above data indicates very small changes in both the boiling points and the distillate compositions, as the distillation progressed. A statistical analysis of the data also indicates the true ternary azeotrope of 1,1,2-trichlorotrifluoroethane, trans-1,2-dichloroethylene and n-propanol has the following characteristics at atmospheric pressure (99 percent confidence limits):

| 1,1,2-trichlorotrifluoroethane | = 63.4 wt. % |
|---|---|
| trans-1,2-dichloroethylene | = 36.4 wt. % |

Analysis of the above data indicates very small changes in both the boiling points and the distillate compositions, as the distillation progressed. A statistical analysis of the data also indicates that a true ternary azeotrope of 1,1,2-trichlorotrifluoroethane, trans-1,2-dichloroethylene and isopropanol has the following characteristics at atmospheric pressure (99 percent confidence limits):

| 1,1,2-trichlorotrifluoroethane | = 64.8 wt. % |
|---|---|
| trans-1,2-dichloroethylene | = 33.2 wt. % |

| | -continued | |
|---|---|---|
| isopropanol | = 2.0 wt. % | |

EXAMPLE 4

A solution which contained 74.41 weight percent CFC-113, 19.38 weight percent trans-1,2-dichloroethylene and 6.21 weight percent acetone was prepared in a suitable container and mixed thoroughly.

The solution was distilled in a Perkin-Elmer Model 251 Autoannular Spinning Band Still (200 plate fractionating capability), using a 10:1 reflux to take-off ratio. Head and pot temperatures were read directly to 0.01° C. and 0.1 ° C., respectively. All temperatures were adjusted to 760 mm pressure. Distillate compositions were determined by gas chromatography. Results obtained are summarized in Table 4.

TABLE 4

DISTILLATION OF:
(74.41% + 19.38% + 6.21%)
CFC-113, TRANS-1,2-DICHLOROETHYLENE AND ACETONE

| | TEMP. °C. | | WT. % DISTILLED OR | WEIGHT % | | |
|---|---|---|---|---|---|---|
| CUTS | POT | HEAD | RECOVERED | CFC-113 | TRS-1,2-DCE | ACETONE |
| Fore-shot | 44.0 | 43.82 | 5.4 | 71.91 | 22.13 | 5.96 |
| 1 | 44.0 | 43.89 | 16.1 | 72.48 | 21.33 | 6.19 |
| 2 | 44.0 | 43.90 | 27.4 | 72.67 | 21.08 | 6.25 |
| 3 | 43.9 | 43.91 | 41.5 | 72.83 | 20.85 | 6.32 |
| 4 | 44.0 | 43.91 | 56.5 | 73.11 | 20.46 | 6.43 |
| 5 | 44.0 | 43.91 | 67.6 | 73.46 | 19.97 | 6.57 |
| 6 | 44.2 | 43.95 | 84.2 | 74.10 | 19.07 | 6.83 |
| 7 | 44.7 | 43.95 | 89.6 | 75.04 | 17.73 | 7.23 |
| Heel | | | 98.7 | 86.40 | 10.12 | 3.48 |

Analysis of the above data indicates very small changes in both the boiling points and the distillate compositions, as the distillation progressed. A statistical analysis of the data also indicates that the true ternary azeotrope 1,1,2- trichlorotrifluoroethane, trans-1,2-dichloroethylene and acetone has the following characteristics at atmospheric pressure (99 percent confidence limits):

| 1,1,2-trichlorotrifluoroethane | = 72.9 wt. % |
|---|---|
| trans-1,2-dichloroethylene | = 20.7 wt. % |
| acetone | = 6.4 wt. % |

EXAMPLE 5

A solution which contained 67.40 weight percent CFC-113, 28.80 weight percent trans-1,2-dichloroethylene, 3.50 weight percent ethanol and 0.30 weight percent nitromethane was prepared in a suitable container and mixed thoroughly.

The solution was distilled in a Perkin-Elmer Model 251 Autoannular Spinning Band Still (200 plate fractionating capability), using a 10:1 reflux to take-off ratio. Head and pot temperatures were read directly to 0.01° C. and 0.1° C., respectively. All temperatures were adjusted to 760 mm pressure. Distillate compositions were determined by gas chromatography. Results obtained are summarized in Table 4.

TABLE 5

DISTILLATION OF:
(67.40% + 28.80% + 3.50% + 0.30%)
CFC-113, TRANS-1,2-DICHLOROETHYLENE, ETHANOL AND NITROMETHANE

| | TEMP. °C. | | WT. % DISTILLED OR | WEIGHT % | | | |
|---|---|---|---|---|---|---|---|
| CUTS | POT | HEAD | RECOVERED | CFC-113 | TRANS 1,2-DCE | ETOH | NITMET |
| Fore-shot | 41.9 | 42.41 | 3.9 | 65.86 | 30.67 | 3.47 | N.D. |
| 1 | 42.0 | 42.47 | 16.4 | 65.89 | 30.66 | 3.44 | 0.005 |
| 2 | 42.0 | 42.49 | 29.3 | 65.89 | 30.65 | 3.45 | 0.01 |
| 3 | 42.0 | 42.40 | 41.0 | 65.88 | 30.66 | 3.45 | 0.01 |
| 4 | 42.0 | 42.52 | 53.5 | 65.89 | 30.65 | 3.45 | 0.01 |
| 5 | 42.0 | 42.51 | 66.5 | 65.92 | 30.62 | 3.45 | 0.01 |
| 6 | 42.8 | 42.51 | 77.0 | 65.94 | 30.60 | 3.45 | 0.01 |
| 7 | 42.8 | 42.51 | 87.2 | 65.98 | 30.56 | 3.45 | 0.01 |
| Heel | | | 98.5 | 79.06 | 14.12 | 4.26 | 2.56 |

Analysis of the above data indicates very small changes in both the boiling points and the distillate compositions, as the distillation progressed. A statistical analysis of the data also indicates that a true quaternary azeotrope of 1,1,2- trichlorotrifluorethane, trans-1,2- dichloroethylene, ethanol and nitromethane has the following characteristics at atmospheric pressure (99 percent confidence limits):

| 1,1,2-trichlorotrifluoroethane | = 65.9 wt. % |
|---|---|
| trans-1,2-dichloroethylene | = 30.6 wt. % |
| ethanol | = 3.5 wt. % |
| nitromethane | = 0.01 wt. % |

EXAMPLE 6

A solution which contained 81.04 weight percent CFC-113, 13.60 weight percent trans-1,2-dichloroethylene 4.36 weight percent acetone and 1.00 weight percent nitromethane was prepared in a suitable container and mixed thoroughly.

The solution was distilled in a Perkin-Elmer Model 251 Autoannular Spinning Band Still (200 plate fractionating capability), using a 10:1 reflux to take-off ratio. Head and pot temperatures were read directly to 0.01° C. and 0.1° C., respectively. All temperatures were adjusted to 760 mm pressure. Distillate compositions were determined by gas chromatography. Results obtained are summarized in Table 6.

TABLE 6

DISTILLATION OF:
(81.04% + 13.60% + 4.36% + 1.00%)
CFC-113, TRANS-1,2-DICHLOROETHYLENE, ACETONE AND NITROMETHANE

| | TEMP, °C. | | WT. % DISTILLED OR | WEIGHT % | | |
|---|---|---|---|---|---|---|
| CUTS | POT | HEAD | RECOVERED | CFC-113 | TRANS 1,2-DCE | ACETN | NITMET |
| Fore-shot | 44.0 | 43.88 | 3.9 | 73.33 | 20.60 | 6.05 | 0.0145 |
| 1 | 44.0 | 43.97 | 16.0 | 74.16 | 19.43 | 6.39 | 0.0197 |
| 2 | 44.5 | 43.99 | 28.9 | 74.24 | 19.29 | 6.46 | 0.0093 |
| 3 | 44.7 | 44.00 | 41.4 | 74.32 | 19.16 | 6.50 | 0.0101 |
| 4 | 45.0 | 43.99 | 52.1 | 74.29 | 19.27 | 6.42 | 0.0153 |
| 5 | 45.6 | 44.16 | 60.4 | 74.38 | 19.64 | 5.93 | 0.0433 |
| 6 | 46.0 | 44.30 | 66.7 | 83.46 | 12.22 | 3.37 | 0.951 |
| Heel | | | 98.7 | 94.14 | 2.09 | 0.63 | 3.14 |

Analysis of the above data indicates very small changes in both the boiling points and the distillate compositions as the distillation progressed. A statistical analysis of the data also indicates that the true quaternary azeotrope of 1,1,2-trichlorotrifluoroethane, trans-1,2-difluoroethylene, acetone and nitromethane has the following characteristics at atmospheric pressure (99 percent confidence limits):

| | |
|---|---|
| 1,1,2-trichlorotrifluoroethane | = 74.3 wt. % |
| trans-1,2-dichloroethylene | = 19.3 wt. % |
| acetone | = 6.4 wt. % |
| nitromethane | = 0.02 wt. % |

EXAMPLE 7

Several single sided circuit boards were coated with activated rosin flux and soldered by passing the board over a preheater to obtain a top side board temperature of approximately 200° F. and then through 500° F. molten solder. The soldered boards were defluxed separately with the five azeotropic mixtures cited in Examples 1 through 6 above by suspending a circuit board, first for three minutes in the boiling sump which contained the azeotropic mixture, then for one minute in the rinse sump which contained the same azeotropic mixture, and finally for one minute in the solvent vapor above the boiling sump. The boards cleaned in each azeotropic mixture had no visible residue remaining thereon.

We claim:

1. An azeotrope or azeotrope-like composition comprising consisting essentially of from about 58–77 weight percent 1,1,2-trichlorotrifluorethane, about 17–39 weight percent trans-1,2-dichloroethylene and an oxygenated compound selected from the group consisting of about 2–5 weight percent ethanol, about 0.1–2.0 weight percent n-propanol, about 1–5 weight percent isopropanol and about 4–8 weight percent acetone wherein the composition has a boiling point of about 42.6°–44.2° C., at 760 mm Hg.

2. The azeotrope or azeotrope-like composition of claim 1, wherein the composition is about 60–70 weight percent 1,1,2-trichlorotrifluoroethane, about 27–35 weight percent trans-1,2-dichloroethylene and about 2–5 weight percent ethanol.

3. The azeotrope or azeotrope-like composition of claim 2, wherein the composition is about 65.37 weight percent 1,1,2-trichlorotrifluoroethane, and about 31.30 weight percent trans-1,2-dichloroethylene and about 3.33 weight percent ethanol.

4. The azeotrope or azeotrope-like composition of claim 3, wherein the composition has a boiling point of about 42.6° C., at substantially atmospheric pressure.

5. The azeotrope or azeotrope-like composition of claim 1, wherein the composition is about 58–68 weight percent 1,1,2-trichlorotrifluoroethane, about 33–39 weight percent trans-1,2-dichloroethylene and about 0.1–2.0 weight percent n-propanol.

6. The azeotrope or azeotrope-like composition of claim 5, wherein the composition is about 63.4 weight percent 1,1,2-trichlorotrifluoroethane, about 36.4 weight percent trans-1,2-dichloroethylene and about 0.2 weight percent n-propanol.

7. The azeotrope or azeotrope-like composition of claim 6, wherein the composition has a boiling point of about 44.2° C., at substantially atmospheric pressure.

8. The azeotrope or azeotrope-like composition of claim 1, wherein the composition is about 59–69 weight percent 1,1,2-trichlorotrifluoroethane, about 30–36 weight percent trans-1,2-dichloroethylene and about 1–5 weight percent isopropanol.

9. The azeotrope or azeotrope-like composition of claim 8, wherein the composition is about 64.8 weight percent 1,1,2-trichlorotrifluoroethane, about 33.2 weight percent trans-1,2-dichloroethylene and about 2.0 weight percent isopropanol.

10. The azeotrope or azeotrope-like composition of claim 9, wherein the composition has a boiling point of about 43.8° C., at substantially atmospheric pressure.

11. The azeotrope or azeotrope-like composition of claim 1, wherein the composition is about 67–77 weight percent 1,1,2-trichlorotrifluoroethane, about 17–24 weight percent trans-1,2-dichloroethylene and about 4–8 weight percent acetone.

12. The azeotrope or azeotrope-like composition of claim 11, wherein the composition is about 72.9 weight percent 1,1,2-trichlorotrifluoroethane, about 20.7 weight percent trans-1,2-dichloroethylene and about 6.4 weight percent acetone.

13. The azeotrope or azeotrope-like composition of claim 12, wherein the composition has a boiling point of about 43.9° C., at substantially atmospheric pressure.

14. A process for cleaning a solid surface which comprises treating said surface with the azeotrope or azeotrope-like compositions of claim 1.

15. The process of claim 14, wherein the solid surface is a printed circuit board contaminated with flux and flux-residues.

16. The process of claim 15, wherein the solid surface is a metal.

17. An azeotrope or azeotrope-like composition comprising consisting essentially of from about 58-77 weight percent 1,1,2- trichlorotrifluoroethane, about 17-39 weight percent trans- 1,2-dichloroethylene, about 0.01-1.0 weight percent nitromethane and an oxygenated compound selected from the group consisting of about 2-5 weight percent ethanol or about 4-8 weight percent acetone wherein the composition has a boiling point of about 42.6-44.2° C., at 760 mm Hg.

18. The azeotrope or azeotrope-like composition of claim 17, wherein the composition is about 60-70 weight percent 1,1,2-trichlorotrifluoroethane, about 27-34 weight percent trans-1,2-dichloroethylene, about 1-5 weight nitromethane.

19. The azeotrope or azeotrope-like composition of claim 18, wherein the composition is about 65.9 weight percent 1,1,2-trichlorotrifluoroethane, and about 30.6 weight percent trans-1,2-dichloroethylene, and about 3.5 weight percent ethanol and about 0.01 weight percent nitromethane.

20. The azeotrope or azeotrope-like composition of claim 19, wherein the composition has a boiling point of about 42.5° C., at substantially atmospheric pressure.

21. The azeotrope or azeotrope-like composition of claim 17, wherein the composition is about 69-79 weight percent 1,1,2-trichlorotrifluoroethane, about 16-22 weight percent trans-1,2 dichloroethylene, about 4-8 weight percent acetone and about 0.01-1.0 weight percent nitromethane.

22. The azeotrope or azeotrope-like composition of claim 21, wherein the composition is about 74.3 weight percent 1,1,2-trichlorotrifluoroethane, about 19.3 weight percent trans-1,2-dichloroethylene, about 6.4 weight percent acetone and about 0.02 weight percent nitromethane.

23. The azeotrope or azeotrope-like composition of claim 22, wherein the composition has a boiling point of about 44.0° C., at substantially atmospheric pressure.

24. A process for cleaning a solid surface which comprises treating said surface with the azeotrope or azeotrope-like compositions of claim 17.

25. The process of claim 24, wherein the solid surface is a printed circuit board contaminated with flux and flux-residues.

26. The process of claim 25, wherein the solid surface is a metal.

* * * * *